US012568598B2

(12) United States Patent
Dittus et al.

(10) Patent No.: US 12,568,598 B2
(45) Date of Patent: Mar. 3, 2026

(54) DAMPING SYSTEMS AND METHODS FOR SERVER SLIDES

(71) Applicants: CIS Global LLC, Tucson, AZ (US); Asia Pacific CIS (Wuxi) Co. Ltd., Wuxi (CN)

(72) Inventors: Karl Klaus Dittus, Raleigh, NC (US); Juanjuan Xie, Wuxi (CN)

(73) Assignees: Asia Pacific CIS (Wuxi) Co. Ltd., Wuxi (CN); CIS Global LLC, Tucson, AZ (US)

( * ) Notice: Subject to any disclaimer, the term of this patent is extended or adjusted under 35 U.S.C. 154(b) by 289 days.

(21) Appl. No.: 18/514,971

(22) Filed: Nov. 20, 2023

(65) Prior Publication Data

US 2024/0090156 A1     Mar. 14, 2024

Related U.S. Application Data

(63) Continuation-in-part of application No. 18/465,731, filed on Sep. 12, 2023, and a continuation-in-part of application No. 18/465,729, filed on Sep. 12, 2023.

(30) Foreign Application Priority Data

Sep. 13, 2022    (CN) .......................... 202211111677.3
Sep. 13, 2022    (CN) .......................... 202222419765.1

(51) Int. Cl.
    *H05K 7/20*          (2006.01)
    *H05K 7/14*          (2006.01)
(52) U.S. Cl.
    CPC ....... *H05K 7/1489* (2013.01); *H05K 7/20236* (2013.01); *H05K 7/20772* (2013.01)

(58) Field of Classification Search
    CPC ............. H05K 7/1489; H05K 7/20236; H05K 7/20772; H05K 7/20781
    (Continued)

(56) References Cited

U.S. PATENT DOCUMENTS 10,405,457 B2     9/2019   Boyd et al.
10,512,192 B2    12/2019   Miyoshi
                 (Continued)

FOREIGN PATENT DOCUMENTS

CN         114845528  A      8/2022
CN         115016611  A      9/2022
               (Continued)

*Primary Examiner* — Zhengfu J Feng
(74) *Attorney, Agent, or Firm* — Quarles & Brady LLP

(57) ABSTRACT

A server system can include a tank that contains cooling fluid and a server slide that is immersed within the cooling fluid to movably support a server chassis relative to the tank. In one example, the server slide may include a slide assembly that is extendable between a contracted orientation, in which the slide assembly supports the server chassis with the server chassis within the cooling fluid and an extended orientation, in which the slide assembly supports the server chassis with the server chassis outside the cooling fluid. The server system may further include a damping system having an enclosure that defines an interior volume and a piston slidably arranged within the interior volume. In one example, the interior volume is open to the tank via a fluid channel that receives the cooling fluid into the interior volume to dampen movement of the slide assembly.

20 Claims, 20 Drawing Sheets

(58) Field of Classification Search
USPC ..................................................... 361/679.53
See application file for complete search history.

(56) References Cited

U.S. PATENT DOCUMENTS

| | | | |
|---|---|---|---|
| 10,820,446 B2 | 10/2020 | Boyd et al. | |
| 11,076,508 B2 | 7/2021 | Gao | |
| 11,219,142 B2 | 1/2022 | Chen et al. | |
| 11,304,340 B2 | 4/2022 | Chen et al. | |
| 11,452,241 B2 | 9/2022 | Tufty et al. | |
| 11,608,217 B1 | 3/2023 | Lau et al. | |
| 11,729,950 B2 | 8/2023 | Chehade et al. | |
| 11,800,683 B2 | 10/2023 | Horng et al. | |
| 11,849,567 B2 | 12/2023 | Gao | |
| 2014/0301037 A1 | 10/2014 | Best | |
| 2015/0181762 A1 | 6/2015 | Boyd et al. | |
| 2017/0064862 A1 | 3/2017 | Miyoishi | |
| 2019/0200482 A1 | 6/2019 | Boyd et al. | |
| 2019/0357385 A1* | 11/2019 | Miyazaki | H05K 7/20236 |
| 2019/0380228 A1* | 12/2019 | Hirai | H05K 7/20772 |
| 2020/0029464 A1* | 1/2020 | Inano | H05K 7/20272 |
| 2020/0323100 A1* | 10/2020 | Chiu | H05K 7/208 |
| 2021/0153390 A1 | 5/2021 | Tufty et al. | |
| 2021/0153392 A1 | 5/2021 | Gao | |
| 2021/0274687 A1 | 9/2021 | Chen et al. | |
| 2021/0378148 A1 | 12/2021 | Chen et al. | |
| 2022/0095476 A1 | 3/2022 | Heydari | |
| 2022/0104393 A1 | 3/2022 | Boyd et al. | |
| 2022/0104394 A1 | 3/2022 | Boyd et al. | |
| 2022/0248558 A1 | 8/2022 | Lin et al. | |
| 2022/0315399 A1 | 10/2022 | Chehade et al. | |
| 2022/0316816 A1 | 10/2022 | Chehade et al. | |
| 2022/0322561 A1 | 10/2022 | Chehade et al. | |
| 2022/0322562 A1 | 10/2022 | Chehade et al. | |
| 2022/0322570 A1 | 10/2022 | Meneboo et al. | |
| 2022/0322571 A1 | 10/2022 | Chehade et al. | |
| 2022/0322572 A1 | 10/2022 | Chehade et al. | |
| 2022/0322573 A1 | 10/2022 | Chehade et al. | |
| 2022/0322575 A1 | 10/2022 | Hnayno et al. | |
| 2022/0322576 A1 | 10/2022 | Chehade et al. | |
| 2022/0322577 A1 | 10/2022 | Bauchart et al. | |
| 2022/0400584 A1* | 12/2022 | Enright | H05K 7/20381 |
| 2023/0049108 A1* | 2/2023 | Gao | H05K 7/203 |

FOREIGN PATENT DOCUMENTS

| | | |
|---|---|---|
| CN | 116321934 A | 6/2023 |
| CN | 116437619 A1 | 7/2023 |
| CN | 116204053 B | 8/2023 |
| EP | 4068932 A1 | 10/2022 |
| WO | 2022/208404 A1 | 10/2022 |

* cited by examiner

1710

1215

1705

DAMPING SYSTEMS AND METHODS FOR SERVER SLIDES

CROSS-REFERENCE TO RELATED APPLICATIONS

This application is a continuation-in-part of U.S. application Ser. No. 18/465,731, filed Sep. 12, 2023, and U.S. application Ser. No. 18/465,729, filed Sep. 12, 2023, each of which are herein incorporated by reference in their entirety.

BACKGROUND

Servers may include hardware and software that provide resources, data, services, or programs to other computing devices. Due to the increase in data consumption and computational demands, some server components (e.g., various electronic components supported by a server chassis) may be at risk of overheating during use.

SUMMARY

Some embodiments of the invention provide a server system. The server system can include a tank that contains cooling fluid and a server slide that is immersed within the cooling fluid to movably support a server chassis relative to the tank. In one example, the server slide may include a slide assembly that is extendable between a contracted orientation, in which the slide assembly supports the server chassis with the server chassis within the cooling fluid and an extended orientation, in which the slide assembly supports the server chassis with the server chassis outside the cooling fluid. The server system may further include a damping system having an enclosure that defines an interior volume and a piston slidably arranged within the interior volume. In one example, the interior volume is open to the tank via a fluid channel that receives the cooling fluid into the interior volume to dampen movement of the slide assembly.

Some embodiments of the invention provide a server slide for use in an immersion cooling system. The server slide may include a slide assembly that is telescopically movable to adjust a position of a server and is at least partly surrounded by a cooling liquid and a damping system. The damping system may include, an enclosure defining an interior volume and a piston positioned within the interior volume. In one example, the slide assembly is telescopically vertically extendable to actuate the piston in a first direction and draw the cooling liquid into the interior volume of the enclosure and telescopically vertically retractable to actuate the piston in a second direction and expel cooling liquid from within the interior volume.

Some embodiments of the invention provide a method of damping movement of a server slide in a server system. The method including, moving the server slide in an upward vertical direction to raise a server supported by the server slide out of a tank of cooling liquid, so that upward vertical movement of the server slide causes an intake of the cooling liquid from the tank into a damping system of the server slide, and moving the server slide in a downward vertical direction to return the server into the tank of cooling liquid, so that downward vertical movement of the server slide causes the cooling liquid to be expelled from the damping system of the server slide into the tank.

BRIEF DESCRIPTION OF THE DRAWINGS

The accompanying drawings, which are incorporated in and form a part of this specification, illustrate embodiments of the invention and, together with the description, serve to explain the principles of embodiments of the invention.

DETAILED DESCRIPTION

Figure 1:
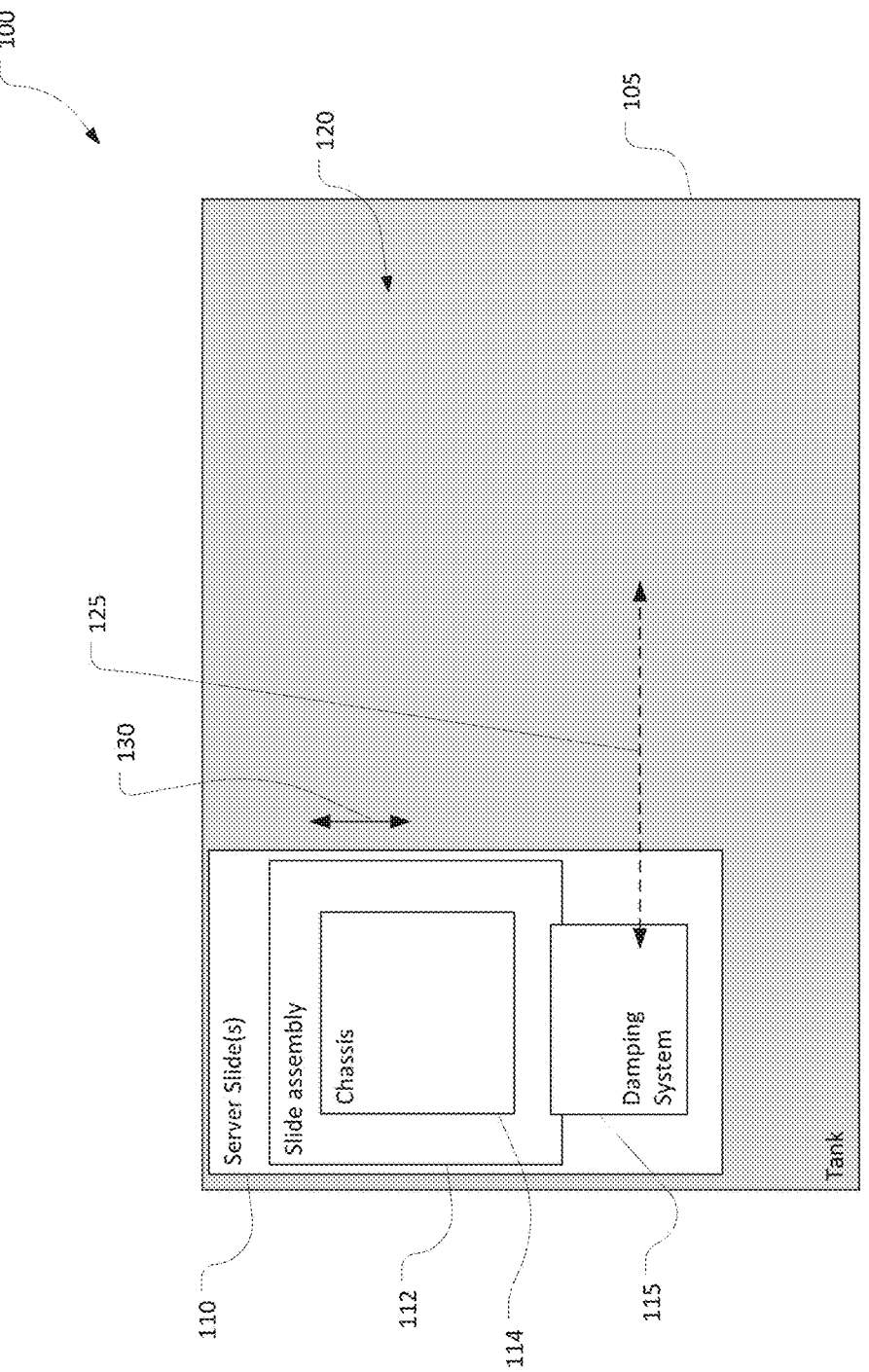
FIG. 1 is a diagrammatic view of an immersion cooling system according to aspects of the present disclosure.

The following discussion is presented to enable a person skilled in the art to make and use embodiments of the invention. Given the benefit of this disclosure, various modifications to the illustrated embodiments will be readily apparent to those skilled in the art, and the principles herein can be applied to other embodiments and applications without departing from embodiments of the invention. Thus, embodiments of the invention are not intended to be limited to embodiments shown, but are to be accorded the widest scope consistent with the principles and features disclosed herein.

The following detailed description is to be read with reference to the figures, in which like elements in different figures have like reference numerals. The figures, which are not necessarily to scale, depict selected embodiments and are not intended to limit the scope of embodiments of the invention. Skilled artisans will recognize the examples provided herein have many useful alternatives and fall within the scope of embodiments of the invention.

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items. Unless specified or limited otherwise, the terms "mounted," "connected," "supported," and "coupled" and variations thereof are used broadly and encompass both direct and indirect mountings, connections, supports, and couplings. Further, "connected" and "coupled" are not restricted to physical or mechanical connections or couplings.

As generally noted above, it may be important to cool servers and related assemblies. In some cases, air cooling of servers may not be adequate to cool the servers to the desired temperature. In this regard, compared with air-cooled servers, liquid-cooled servers may be more effective in cooling the servers. In some examples, it may be useful to install liquid-cooled servers vertically (e.g., for vertical movement in and out of a coolant bath). However, this arrangement can increase the risk of accidentally dropping the server during removal/insertion of the server, which may cause internal or external damage to the server.

In one example, an immersion cooling system may include a tank defining an interior volume configured to retain a cooling fluid (e.g., a dielectric liquid) to facilitate efficient cooling of one or more servers. In one example, the servers may be slidably secured within the tank via one or more server slides. The server slides may be secured in a vertical arrangement (e.g., mounted to one of more sides of the tank via one or more brackets of generally known configurations).

In one example, a user may extend or contract vertically installed server slides to insert or remove the server from within the cooling fluid of the tank. For example, a user may extend a server slide (e.g., may telescopically extend a slide assembly of the server slide) to remove the server from the tank and the cooling liquid—for maintenance or replacement. Similarly, a user may retract (e.g., compress) the slide assembly to return the serve to the tank and the cooling liquid for operation. As noted above, however, in some cases, due to the effects of gravity or user error, the server may accidentally fall within the tank (e.g., via free retraction movement of a telescoping server slide), which may risk damage to the server.

To mitigate the risk of damage to the server (e.g., from falling within the tank as discussed above), a server slide may include a damping system that utilizes the cooling fluid within the tank to damp movement of the server slides. The damping system may include an enclosure that defines an interior volume (e.g., along one or more interior channels each defining a corresponding volume). The damping system may further include one or more pistons or other similar bodies arranged within the interior channels. In one example, pistons (or other damping bodies) may be secured to lower ends of the corresponding server slides, so that movement of the server slides corresponds to reciprocal movement in the pistons.

In some examples, a damping enclosure may further include one or more ports extending through bounding walls of the enclosure. The ports may facilitate the exchange of cooling fluid from within the interior channels to the surroundings (e.g., the tank). In one example, as a server slide is extended, a piston is drawn in a first direction (e.g., vertically upward), which increases the interior volume of the interior channel on one side of the piston. Correspondingly, the movement of the piston draws cooling fluid from the tank into the interior channel via the corresponding port(s). In another example, as the server slide is contracted, the piston is moved in a second, opposite direction (e.g., vertically downward), which decreases the interior volume of the interior channel on the noted side of the piston. Correspondingly, the movement of the piston expels cooling fluid from the interior channel into the tank via the corresponding port(s). This movement of fluid accordingly damps movement of the server slides and can help to mitigate the risk of damage to the server (e.g., from accidental drops when the relevant slide assembly is in an extended configuration).

In one particular example, a cross-sectional area of an interior volume (e.g., channel) is larger than a cross-sectional area of a port that connects the interior volume to a surrounding volume of cooling liquid (e.g., in a tank that holds multiple servers for immersion cooling). This arrangement, for example, can result in a relatively slow flow rate of cooling fluid out of the port, which in turn can help to reduce the contraction speed of the server slides, with a damping response that increases with the velocity of the movement of the corresponding server slide.

Figure 2:
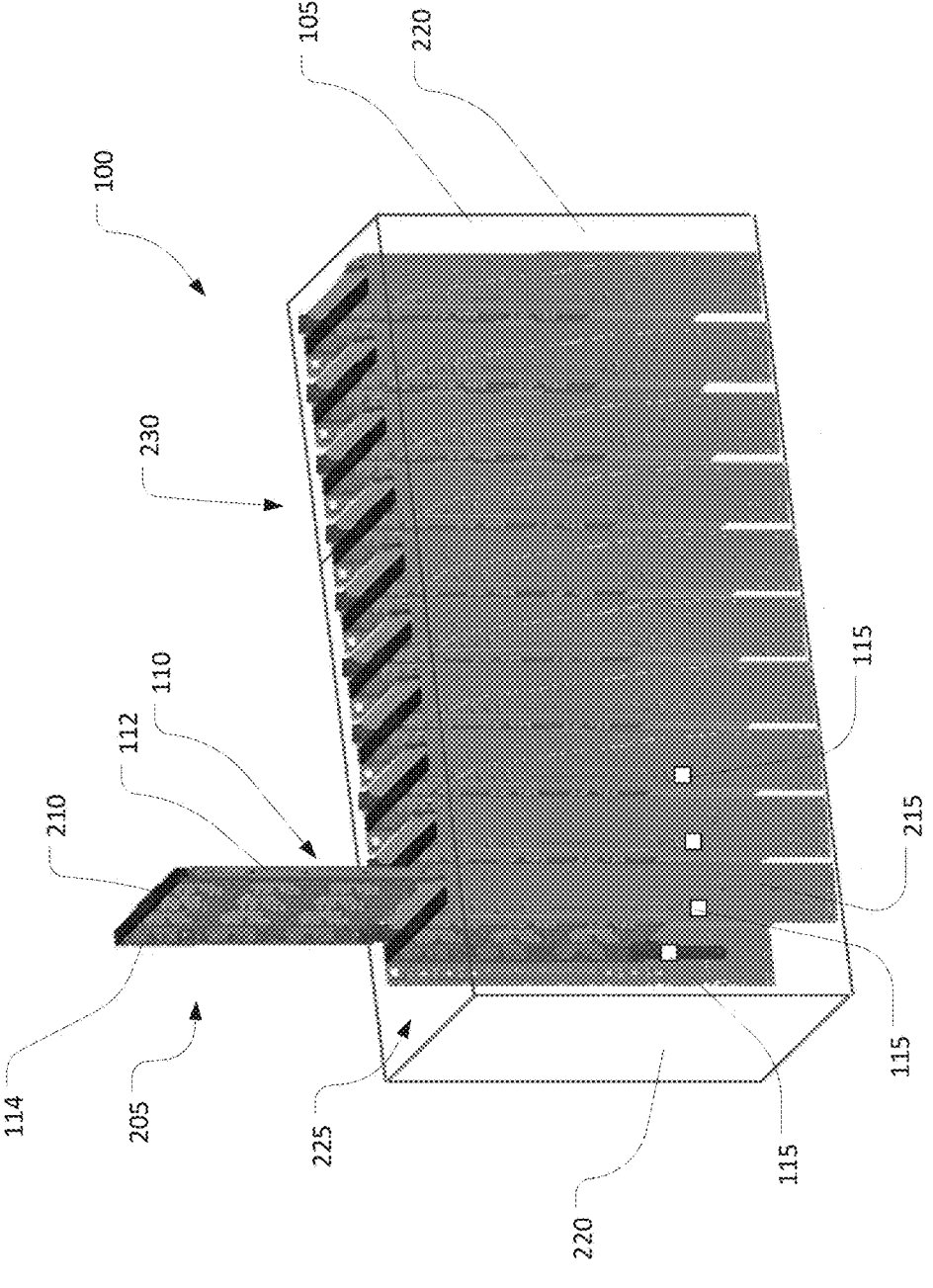
FIG. 2 is a perspective view of the immersion cooling system of FIG. 1.

FIGS. 1 and 2 show an example of an immersion cooling system 100 including a tank 105, which may be filled with a cooling fluid 120. In one example, the cooling fluid 120 may be a dielectric liquid (e.g., mineral oil, purified water, benzene, liquid nitrogen, etc.). Generally, the tank 105 may include one or more walls 220 configured to form a liquid-tight volume with a top opening 225 to retain the cooling fluid 120.

To facilitate efficient cooling of a server 210, the server 210 may be immersed within the cooling fluid 120 (e.g., fully immersed). Further, the server 210 may be held in a slidable relationship with the tank 105 via one or more server slides 110 (e.g., as secured to the walls 220 of the tank 105 via one or more brackets 215). Correspondingly, the server slides 110 can be extended or retracted to move the server 210 into and out of the cooling fluid 120. In particular, the server slides can sometimes include a slide assembly 112, which can be allow telescopic or other relative translation of different slide members for extension or retraction of the server slides 110.

In one example, the server slides 110 may be vertically oriented within the tank 105, such that a user may pull vertically to remove the server 210 from the tank (e.g., as shown by arrow 130). For example, the slide assembly may include a multi-rail telescoping assembly (e.g., as variously known in the art) that can support a server chassis 114 (e.g., as variously known in the art), and the server chassis 114 can in turn support various computational components. Thus, users may be able to change a position of the server chassis 114 relative to the cooling fluid 120 via telescopic extension or retraction of the slide assembly 112. However, due to the effects of gravity, while returning the server 210 into the cooling fluid 120, the server 210 may sometimes fall too quickly, which may cause damage to the server 210 upon impact at the bottom end of the range of travel.

Thus, the server slides 110 may include a damping system 115 to help reduce the velocity of movement of the slide assembly 112, and of the chassis 114 in particular. Generally, the damping system 115 may utilize the cooling fluid 120 already within the tank 105 to slow or damp movement of the server 210. Thus, if a user accidentally drops the server 210 within the tank 105, the damping system 115 may modulate movement of the cooling fluid 120 within the damping system 115 to slow the movement of the server 210 and thereby mitigate the risk of damage to the server 210.

In one example, as shown by arrow 125, the damping system 115 may exchange volumes of the cooling fluid 120 directly with the tank 105. For example, the damping system 115 may intake the cooling fluid 120 from the tank 105 during expansion of the server slides 110 (e.g., when a user is removing the server 210 for maintenance). Correspondingly, the damping system may expel cooling fluid 120 into the tank 105 during contraction of the server slides 110 (e.g., when a user is returning the server 210 to the tank 105 for operation).

Figure 3:
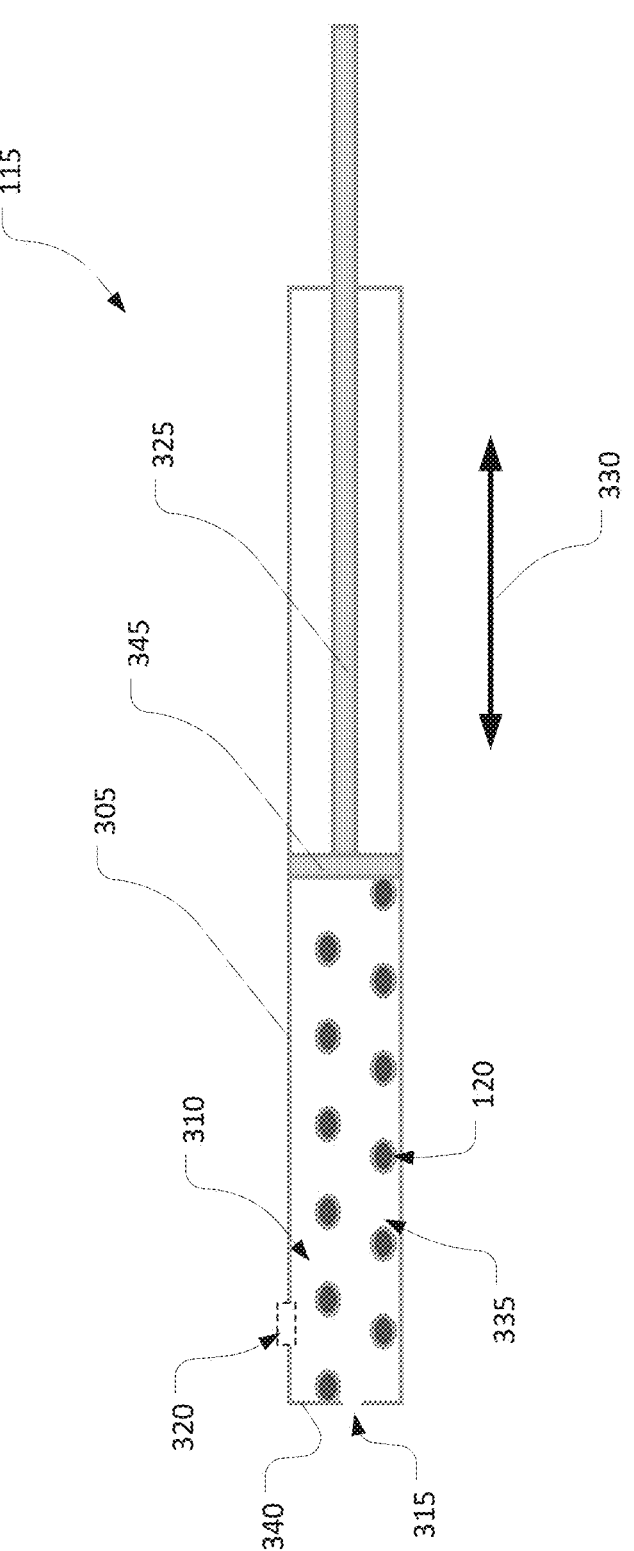
FIG. 3 is a diagrammatic partial view of a damping system of the immersion cooling system of FIG. 1.

FIG. 3 schematically shows an example of configuration of a portion of the damping system 115. In particular, the illustrated example includes an enclosure 305 that defines an interior volume 310 that is configured to receive the cooling fluid 120 from the tank 105. In one example, the interior volume 310 may be defined by an interior channel 335 (e.g., a constant-width channel as shown). In one example, the enclosure 305 may include one or more ports 315 arranged on a base 340 (or other portion) of the enclosure 305. The port(s) 315 may extend through one or more walls of the enclosure 305 to the interior volume 310, to permit the exchange flow of cooling fluid 120 between the tank 105 and the interior volume 310.

In one example, the exchange of cooling fluid 120 may be facilitated by a piston 325 arranged within the channel 335 of the enclosure 305. As generally illustrated in FIG. 3, the piston 325 may include a head 345 configured to seal the interior volume 310 of the channel 335 so that cooling fluid 120 is retained within the channel 335.

In one example, the piston 325 may be actuated based on corresponding actuation of the server slides 110 as shown by arrow 330 (e.g., corresponding to vertical movement of the server slides 110 as shown in FIG. 2). For example, if the server slides 110 are expanded, the piston 325 may be correspondingly moved to draw cooling fluid into the channel 335 via the port(s) 315. Correspondingly, if the server slides 110 are contracted, the piston 325 may be correspondingly moved to expel cooling fluid 120 from the channel 335 via the port(s) 315. Put differently, expansion of the server slides 110 can correspond to an increase of the interior volume 310 on one side of the piston 325 (e.g., the left side as shown) within the channel 335 while contraction of the server slides 110 corresponds to a decrease in the interior volume 310 on that side of the piston 325 within the channel 335.

As should be appreciated, the damping system 115 may include one or more pistons 325 and corresponding channels 335 (or other interior volumes) within a single enclosure 305. In some examples, the enclosure 305 may include one or more additional or alternative ports 320 arranged in one or more areas other than the base 340 of the enclosure 305. For example, the additional or alternative port(s) 320 may be arranged on one or more sidewalls 350 of the enclosure. In other examples, the enclosure 305 may include ports 315, 320 on both the base 340 and the sidewalls 350 (or at other combinations of locations).

Figure 4:
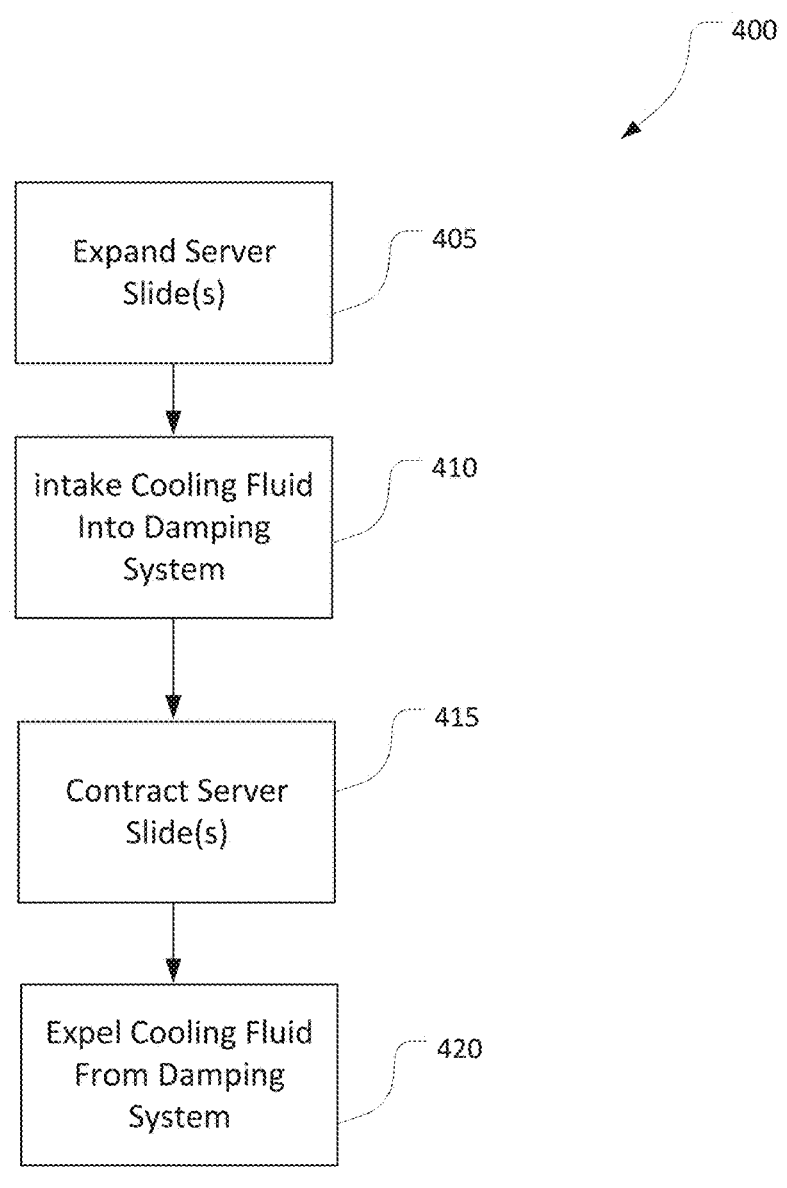
FIG. 4 is a flowchart of a server removal and reinsertion process utilizing the damping system of FIG. 3.
Figure 5:
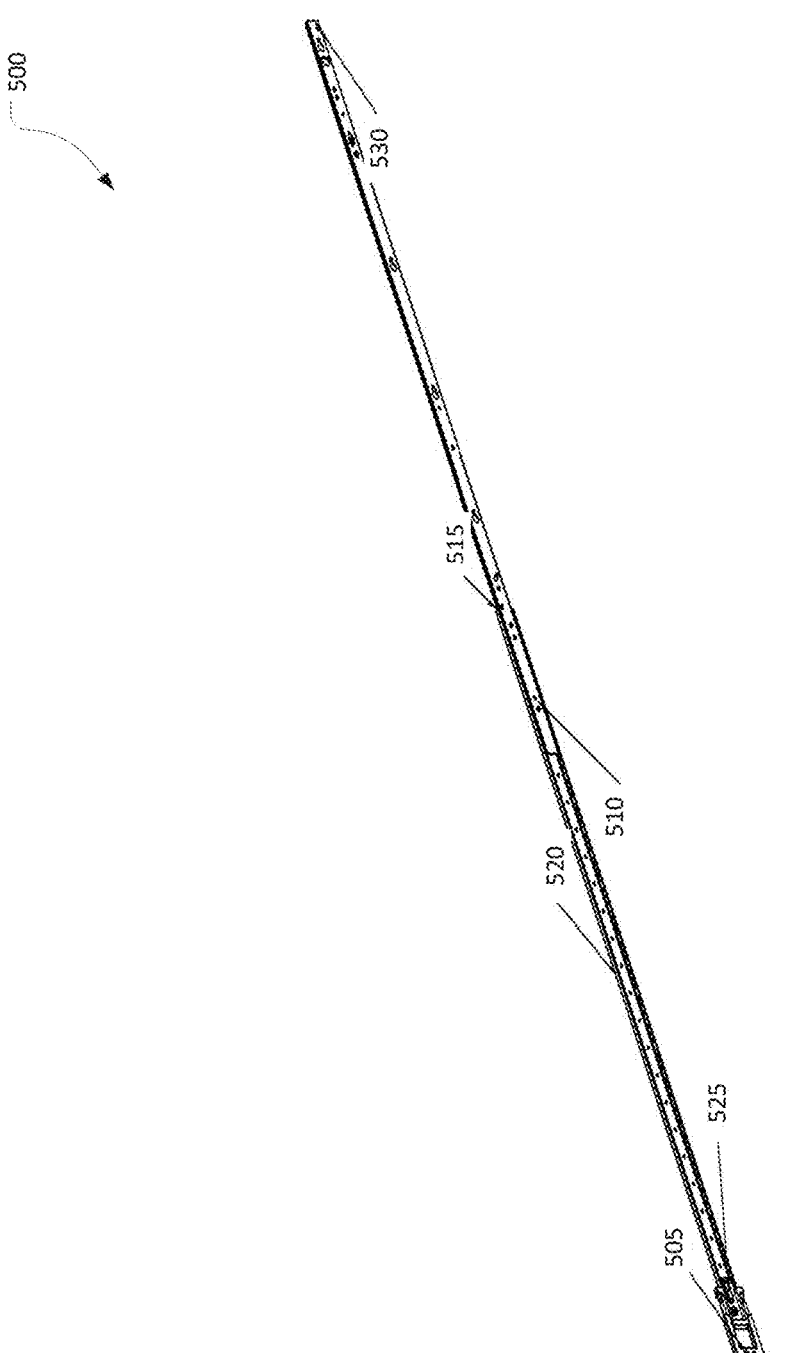
FIG. 5 is a perspective view of a server slide including one example of the damping system of FIG. 3.
Figure 6:
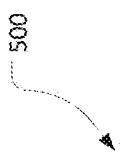
FIG. 6 is a first side view of the server slide of FIG. 5.
Figure 6:
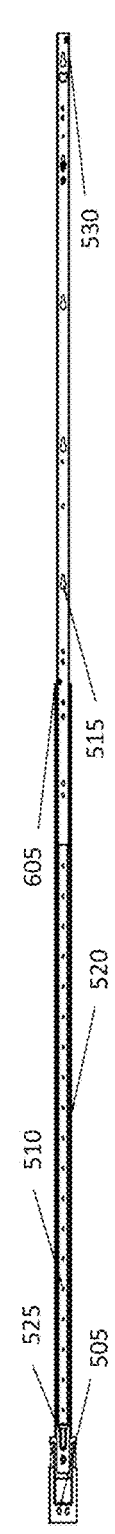
Figure 7:
FIG. 7 is a second side view of the server slide of FIG. 6.
Figure 7:
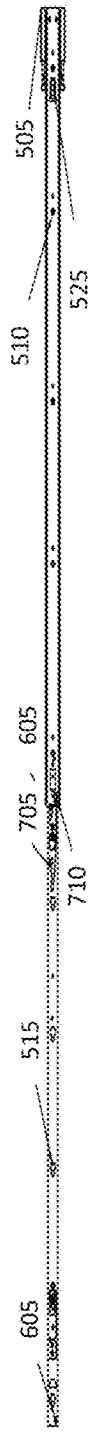
Figure 8:
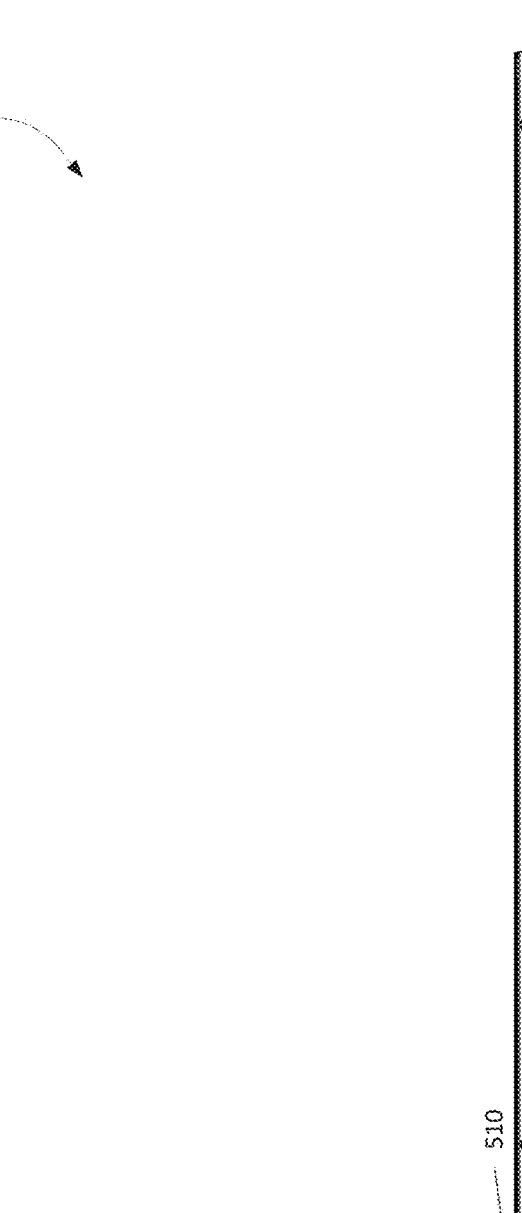
FIG. 8 is another first side view of the server slide of FIG. 5.
Figure 8:
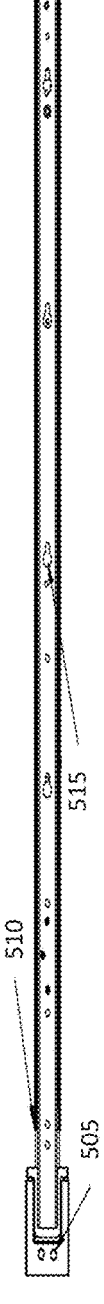
Figure 9:
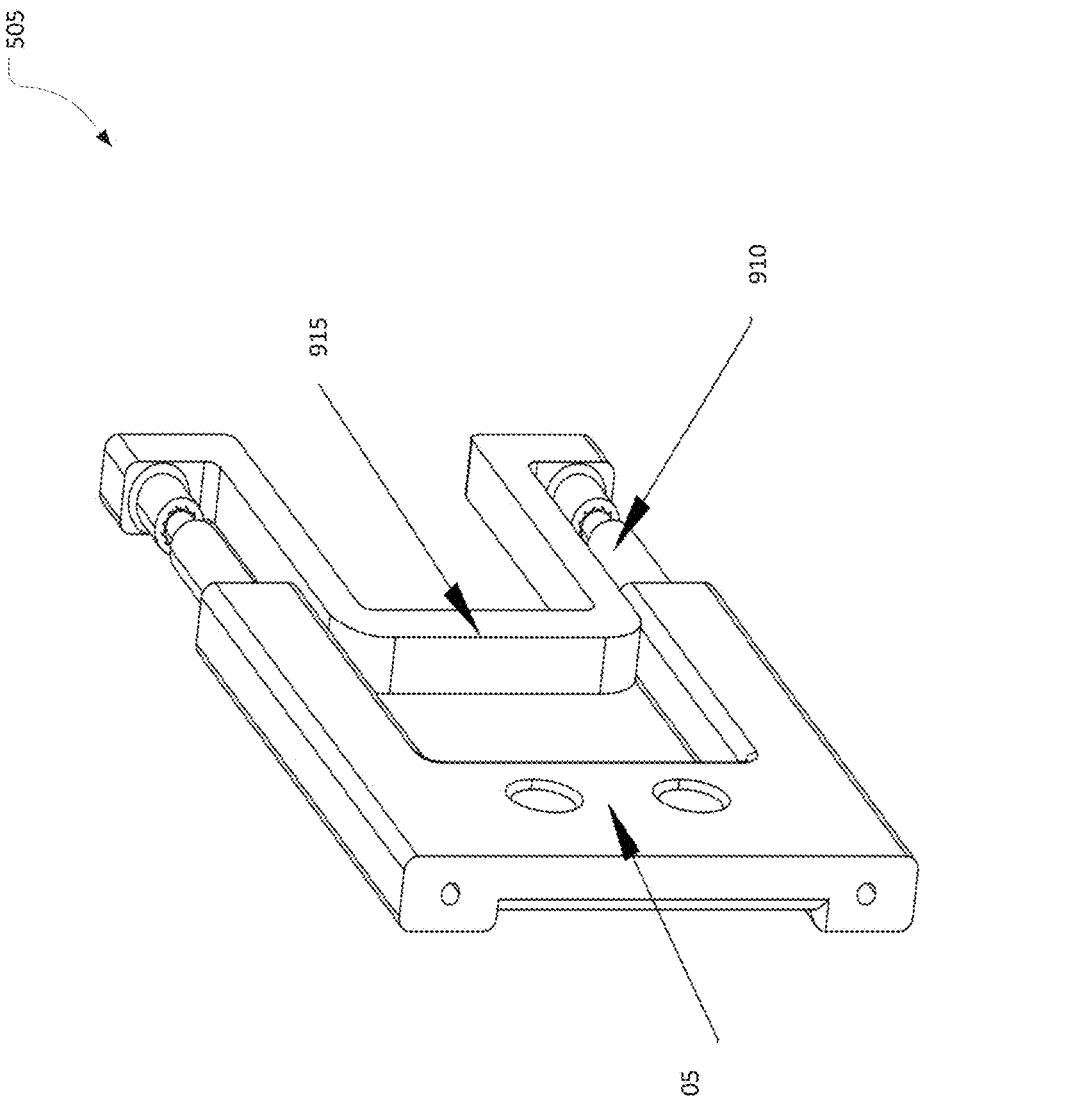
FIG. 9 is a perspective view of one example of the damping system of FIG. 3.
Figure 10:
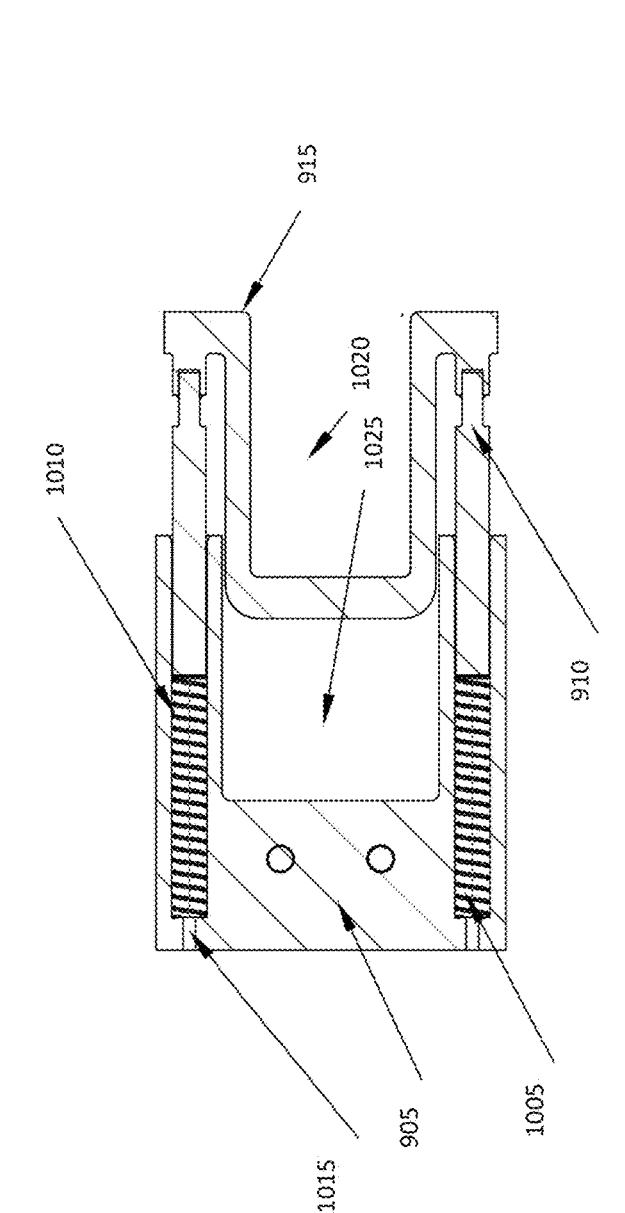
FIG. 10 is a cross-sectional view of the damping system of FIG. 9.
Figure 11:
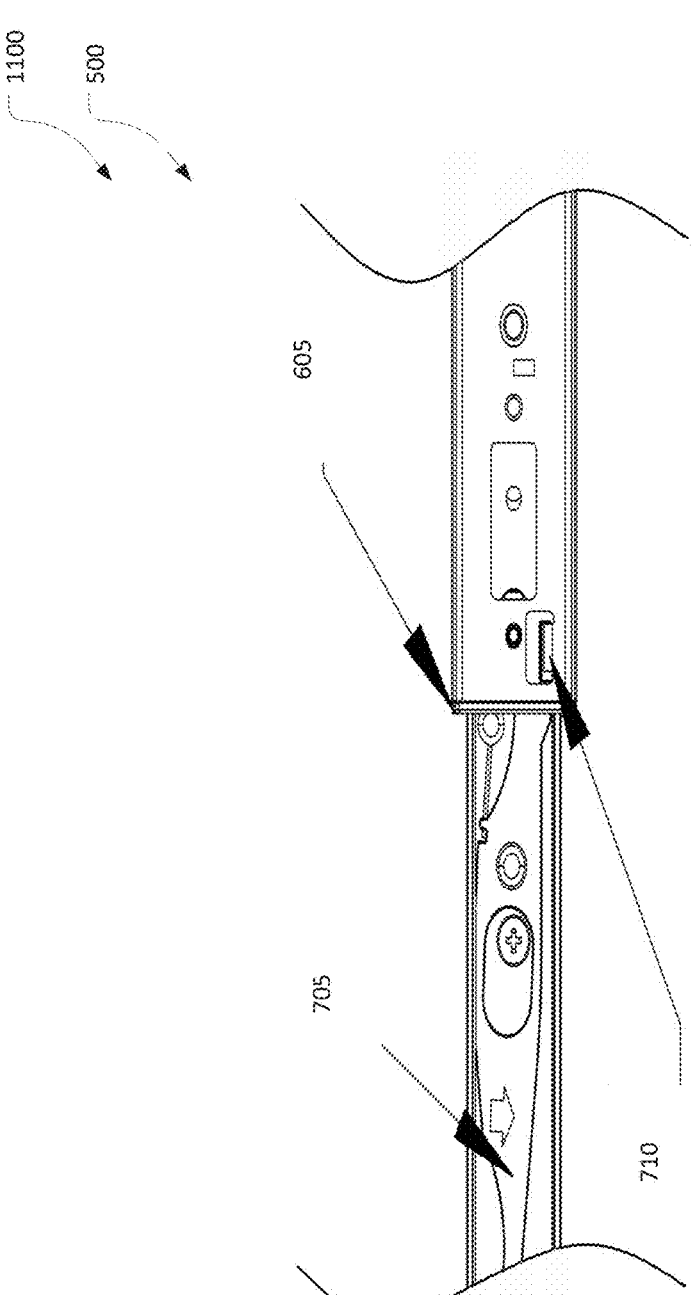
FIG. 11 is a side partial view of one example of a slide release of the server slide of FIG. 5.
Figure 12:
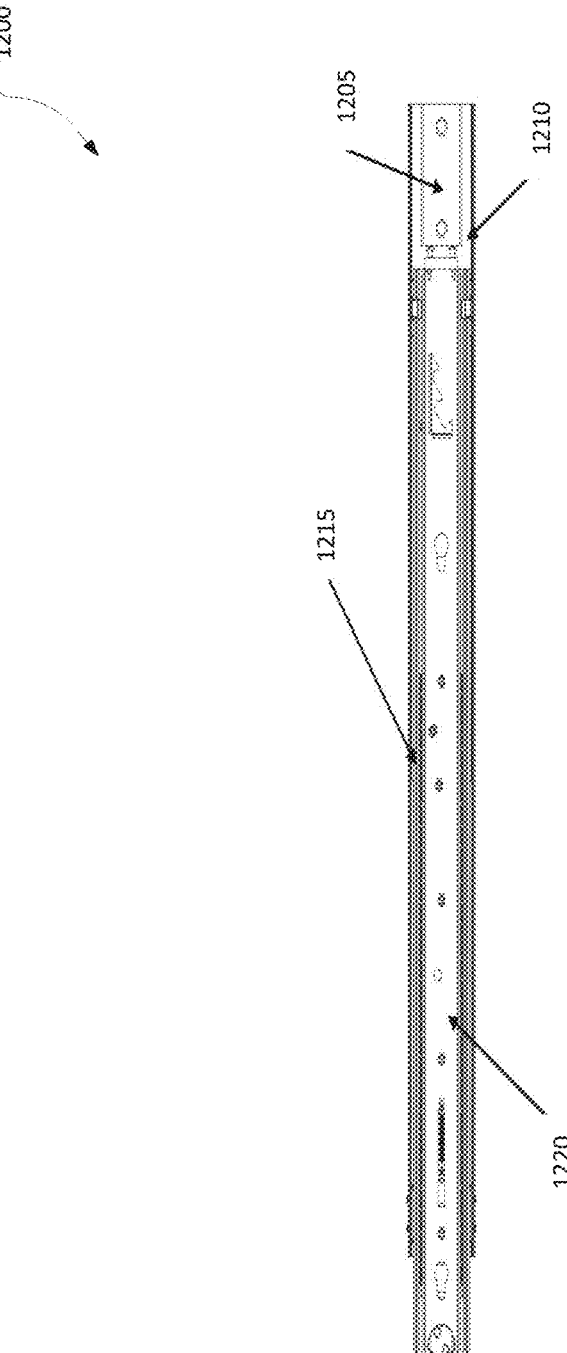
FIG. 12 is a side view of another example of a server slide including another example of the damping system of FIG. 3.
Figure 13:
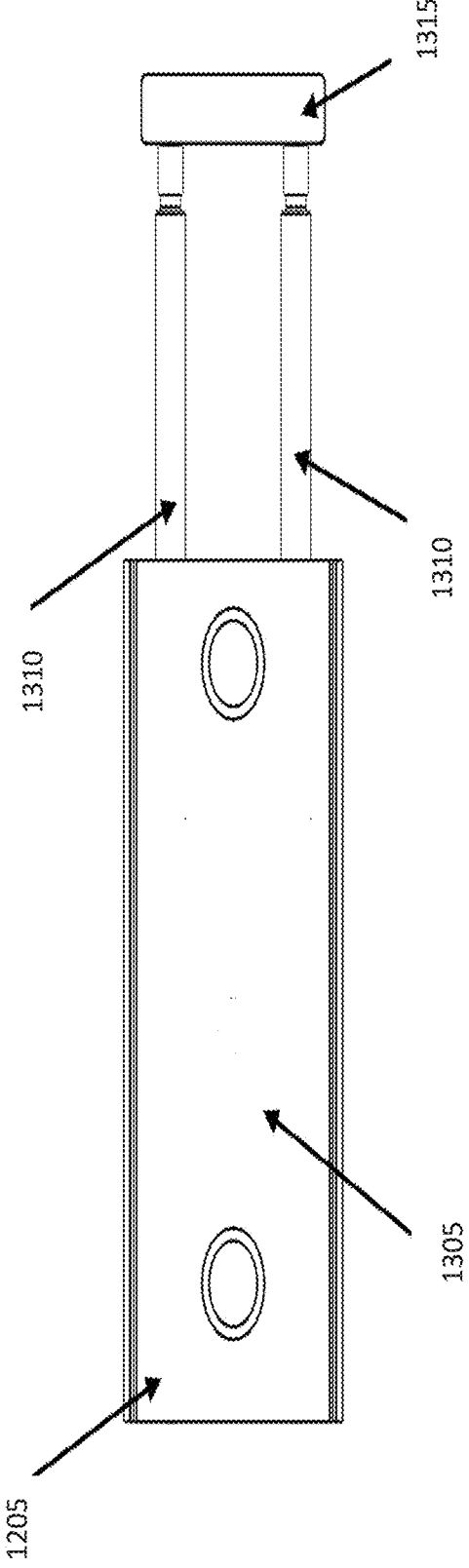
FIG. 13 is a first side view of another example of the damping system of FIG. 3.
Figure 14:
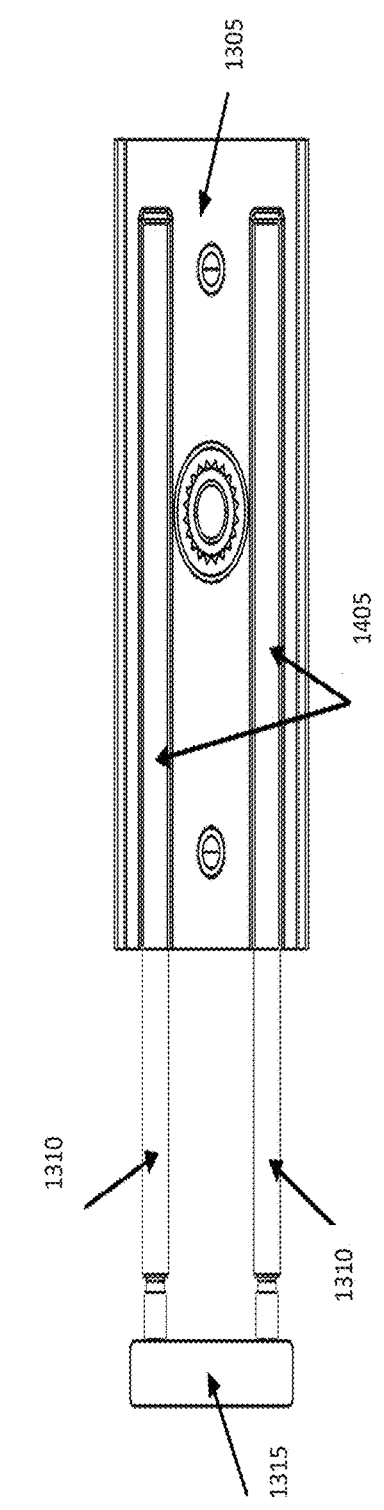
FIG. 14 is a second side view of the damping system of FIG. 13.
Figure 15:
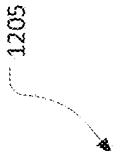
FIG. 15 is an end view of the damping system of FIG. 13.
Figure 15:
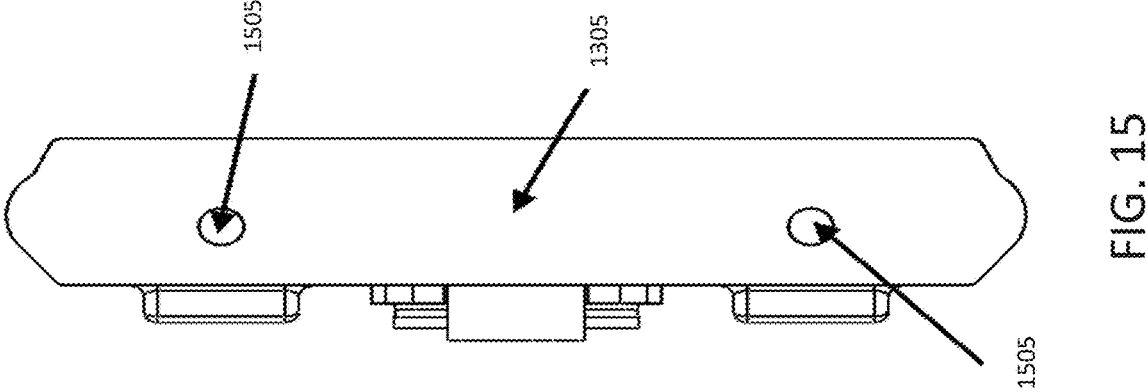
Figure 16:
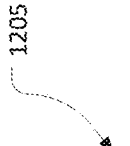
FIG. 16 is a cross-sectional view of the damping system of FIG. 13.
Figure 16:
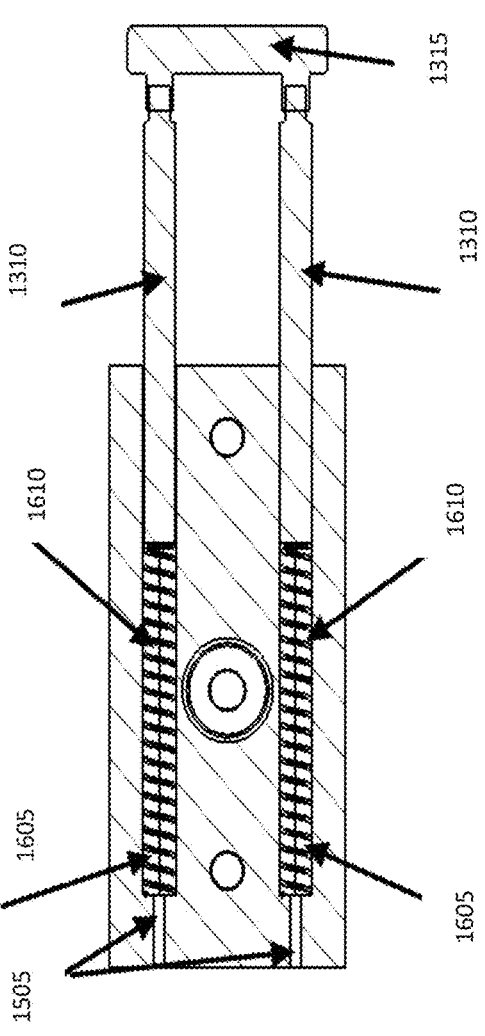
Figure 17:
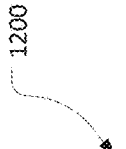
FIG. 17 is side view of another example of a slide release of the server slide of FIG. 12.
Figure 17:
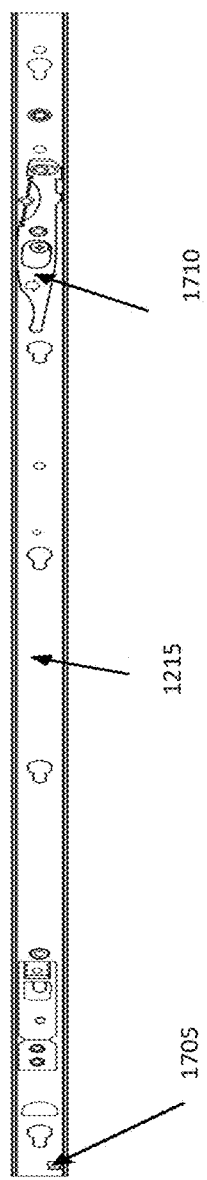
Figure 18:
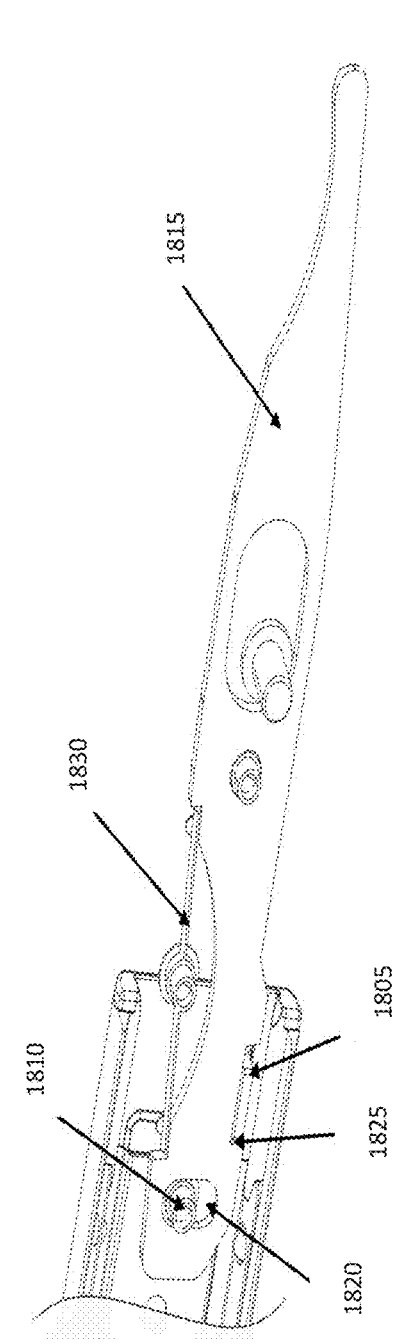
FIG. 18 is a perspective view of the slide release of FIG. 17.
Figure 19:
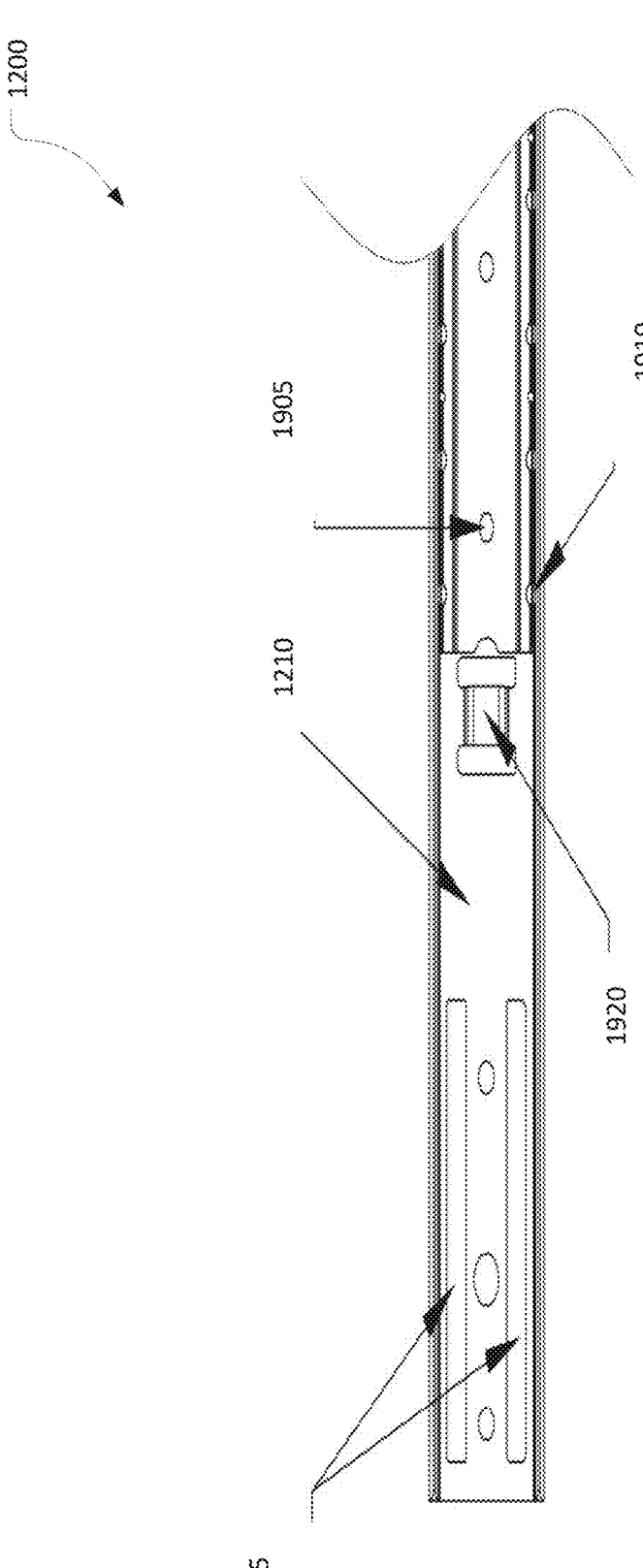
FIG. 19 is a side view of one example of a position limiter of the server slide of FIG. 12.
Figure 20:
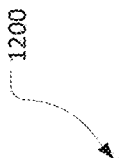
FIG. 20 is a side view of another example of a position limiter of the server slide of FIG. 12.
Figure 20:
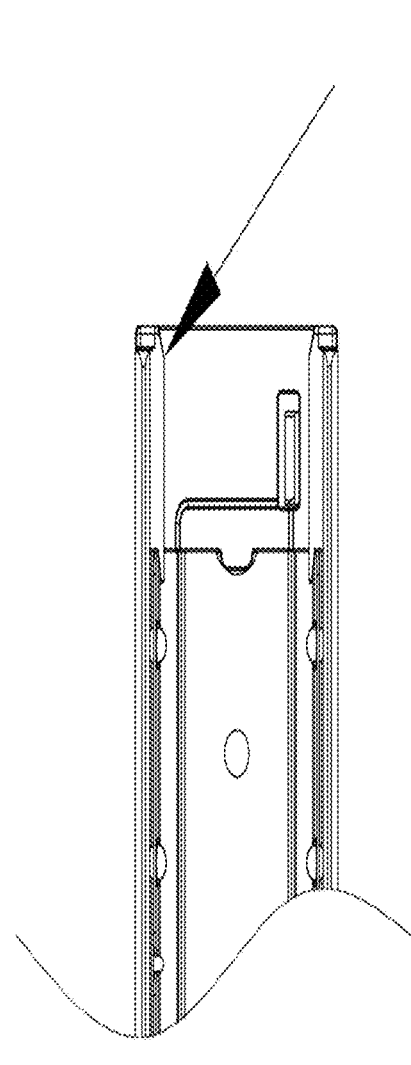

FIG. 4 shows an example process 400 for server removal and reinsertion (e.g., as can be used for removing and reinserting the server 210 from/into the tank 105). At operation 405, a user may grasp the server 210 and apply a vertically oriented force to pull the server 210 from within the tank 105 into an expanded position 205 (shown in FIG. 2). At operation 410, which may occur simultaneously with operation 405, the piston 325 actuates along with the expansion of the server slides 110 to draw cooling fluid 120 into the channel 335 via the one or more ports 315.

At operation 415, the user may disengage a slide locking mechanism to move the server slides 110 from the expanded position 205 back into the contracted position 230 (shown in FIG. 2). At operation 420, which may occur simultaneously with operation 415, the piston actuates along with contraction of the server slides 110 to expel cooling fluid 120 from within the channel 335 via the one or more ports 315. However, as the pressure drop for a given flow rate of the cooling fluid 120 is relatively large (due to the relatively small area of the ports 315) the interaction of the cooling fluid 120 with the damping system 115 acts as a damper on movement (e.g., contraction) of the server slides 110. Thus, even if a user drops the server 210, contraction of the server slides 110 can be substantially slowed by the flow of cooling fluid 120 from within the channel 335 of the damping system 115. Thus, the risk of accidental damage to the server 210 can be mitigated. In one particular example, the cross-sectional area of the channel 335 is large relative to the cross-sectional area of the ports 315 to facilitate the relatively high pressure drop for flow of the cooling fluid 120 from within the channel 335 during contraction of the server slides 110.

FIGS. 5-11 illustrate one example of a server slide 500 including a damping system 505. As will be recognized, the damping system 505 shares a number of components in common with and operates in a similar fashion to the examples illustrated and described previously (e.g., the damping system 115). In this regard, the server slide 500 is one particular example configuration for the server slides 110. For the sake of brevity, common features will not be again described below in detail. Rather, previous discussion of commonly named or numbered features, unless otherwise indicated, also applies to example configurations of the damping system 505.

In one example, the server slide may include a first rail and a second rail immersed in a cooling liquid. The server slide may include a damping system mounted at one end of the first rail. The damping system may include an enclosure defining one or more channels configured to receive one or more pistons. In one example, the pistons are configured to translate (e.g., slide) within the channels during actuation (e.g., expansion/contraction of the server slide). In one example, translation of the pistons within the channels may correspond to an intake or expulsion of cooling fluid from the within the channels of the enclosure.

In another example, the channels may each include a biasing member (e.g., a spring) held within the channel. The biasing member may provide additional damping to the server slide (e.g., by absorbing a portion of an impact force of the server slide). To facilitate the intake or expulsion of cooling fluid to/from within the channels of the enclosure, the enclosure may include one or more ports, which permit fluid flow between the enclosure and the surroundings (e.g., the tank). In one example, the ports may be arranged at an end (e.g., a bottom end) of the enclosure, opposite an end secured to the server slide.

In another example, the damping system may include one or more pistons connected via a sleeve. The sleeve may be substantially U-shaped, with the U-shape defining a groove configured to slide around an end of the server slide to secure the damping system to the server slide. In one particular example, the sleeve may be made from a resilient material (e.g., rubber or any other known resilient material). Corresponding to the U-shape of the sleeve, the enclosure of the damping system may define a U-shape, with the U-shape defining a groove configured to receive and retain a projection of the corresponding sleeve. Thus, when the server slide is in a contracted position, the U-shapes of the enclosure and the sleeve may nest together forming a singular U-shaped assembly. In one particular example, the channels of the enclosure may define a depth that is dimensionally smaller than a length of the enclosure. In another example, a center of the channels of the enclosure and a center of the ports of the enclosure may be coaxially arranged.

In one example, when the slide rail is extended, the pistons translate within the channels of the enclosure in a first direction, which decompresses the biasing element and draws cooling liquid from the surroundings (e.g., the tank) into the channels via the one or more ports. In another example, when the slide rail is contracted, the pistons translate within the channels of the enclosure in a second, opposite direction, which compresses the biasing element and expels cooling liquid from the channels into the surroundings (e.g., the tank) via the one or more ports. Thus, the expulsion of cooling liquid through the ports, in combination with the biasing element, absorbs a portion (or all) of the force generated by dropping the server (e.g., due to gravity), which mitigates the risk of damage to the server and may prolong the lifespan of the server.

Referring still to FIGS. 5-11, in one example, the server slide 500 (and corresponding server 210) may be immersed in the tank 105 filled with the cooling fluid 120 (e.g., a dielectric fluid). The server slide 500 may include a first rail 510 and a second rail 515 slidably (e.g., telescopically) connected to the first rail 510. In one example, the damping system 505 may be mounted to one end of the first rail 510.

In one example, the damping system 505 may include an enclosure 905 defining one or more channels 1005. The channels 1005 may slidingly receive one or more pistons 910. The channels 1005 may further include one or more biasing elements 1010 (e.g., springs) arranged between an end of the channel 1005 and the pistons 910. In one particular example, the pistons 910 may be secured together via a sleeve 915 secured to one end of the pistons 910. In one example, the sleeve 915 may be substantially U-shaped such that the sleeve 915 defines a groove 1020 configured to engage the end of the first rail 510 to secure the damping system 505 to the first rail 510. To facilitate the intake and expulsion of cooling fluid 120 into/out of the channels 1005, the enclosure 905 may include one or more ports 1015. The ports 1015 may permit exchange of cooling fluid 120 with the surroundings (e.g., the tank 105) based on a position of the pistons 910. For example, movement of the pistons 910 in a first direction (corresponding to movement of the server slide 500 in a first direction) may draw cooling fluid into the channels 1005. In another example, movement of the pistons 910 in a second, opposite direction (corresponding to movement of the server slide 500 in a second, opposite direction) may expel cooling fluid from the channels 1005 into the tank 105.

In one example, the sleeve 915 is friction fit to one end of the pistons 910. Further, the sleeve 915 may be made from a resilient material (e.g., rubber or any other known resilient material) to facilitate a friction fit between the groove 1020 the of the sleeve 915 and the end of the first rail 510. Corresponding to the U-shape of the sleeve 915, the enclosure 905 of the damping system 505 may define a U-shape, with the U-shape defining a groove 1025 configured to receive and retain a projection of the corresponding sleeve 915. Thus, when the server slide is in a contracted position, the U-shapes of the enclosure 905 and the sleeve 915 may nest together forming a singular U-shaped assembly. Further, the end of the first rail 510 may nest within the groove 1020 of the sleeve 915 to removably secure the damping system 505 to the first rail 510. In one particular example, the channels 1005 may define a depth that is dimensionally smaller than a length of the enclosure 905.

In one example, the first rail 510 and the second rail 515 may be slidingly connected via a bearing cage 520. The bearing cage 520 may be configured to retain one or more bearings (e.g., roller bearings) between the first and second rails 510, 515 to permit sliding engagement between the first and second rails 510, 515. The first rail 510 may further include a position limiter 525 arranged between the bearing cage 520 and the damping system 505. Opposite the position limiter 525, on an opposing end of the first rail 510, is a first stopper 605. In one example, the bearing cage 520 may be arranged between the position limiter 525 and the stopper 605. In one example, a second stopper 530 may be arranged at an end of the second rail 515 opposite the first stopper 605. In one example, the stoppers 605, 530 may be configured to limit an overall extension distance of the first and second rails 510, 515.

In one example, the first rail 510 may include a slide release 1100 secured to an interior of the first rail 510. The slide release assembly may include a lever 705, which may be selectively actuated by a user to enable actuation of the second rail 515 relative to the first rail 510. For example, actuation of the lever 705 may engage or disengage a protrusion 710 from a slot located on the second rail 515. In one example, the protrusion 710 may be disengaged from the slot when the second rail 515 is contracted within the first rail 510. However, when the second rail 515 is expanded within the first rail 510, the protrusion 710 may automatically lock into the slot (i.e., when the second rail 515 is fully-extended). Thus, the slide release 1100 may lock the second rail 515 into the extended position until a user actuates the lever 705, which disengages the protrusion 710 from the slot and permits contraction of the second rail 515 into the first rail 510.

In one example, when extending the server slide 500, the user may pull the second rail 515 outwards (e.g., out of the first rail 510). The second rail 515 may slide outwards relative to the first rail via one or more roller bearings arranged within the bearing cage 520. The user may continue to pull the second rail 515 out of the first rail 510 until the protrusion 710 of the slide release 1100 engages the slot of the second rail 515. Concurrently with the extension of the second rail 515, the damping system 505 is acting to draw cooling fluid 120 into the channels 1005. For example, as the pistons 910 slide within the channels 1005 (e.g., corresponding to movement of the second rail 515 within the first rail 510) a compression force is removed from the biasing element 1010. Further, as the pistons 910 slide within the channels 1005, cooling fluid 120 from the tank 105 is drawn into the channels 1005 via the one or more ports 1015.

In another example, when contracting the server slide 500, the user may actuate the lever 705 to disengage the protrusion 710 from the slot on the second rail 515 (e.g., via the slide release 1100). Following this, due to gravity, the second rail 515 may begin to contract within the first rail 510. Once the end of the second rail 515 engage the groove 1020 defined by the sleeve 915, the second rail 515 begins to drive the sleeve 915 and thus the pistons 910 downwards (e.g., into the enclosure 905). In one example, as the pistons 910 move within the channels 1005, the pistons 910 begin to compress the biasing element 1010. Movement of the pistons 910 within the channels 1005 additionally forces the cooling fluid 120 out of the channels 1005 through the ports 1015. In one example, the cooling fluid 120 is forced out of the ports 1015 at a low flow rate (e.g., due to the reduction in area between the channels 1005 and the ports 1015), which slows (e.g., damps) the descent of the second rail 515, which in turn reduces the descent speed of the server 210. Thus, the risk of damage to the server 210 is reduced.

FIGS. 12-20 illustrate another example of a server slide 1200 including a damping system 1205. As will be recognized, the damping system 1205 shares a number of components in common with and operates in a similar fashion to the examples illustrated and described previously (e.g., the damping system 115, damping system 505). In this regard, the server slide 1200 is one particular example configuration for the server slides 110. For the sake of brevity, common features will not be again described below in detail. Rather, previous discussion of commonly named or numbered features, unless otherwise indicated, also applies to example configurations of the damping system 1205.

In one example, the server slide may include a first (e.g., fixed rail) and a second (e.g., movable rail), which may be immersed in a cooling liquid configured to cool a server secured to the server slide. In one example, one end of the first rail may include a damping system including an enclosure fixed to the first rail. The enclosure may include one or more channels configured to receive one or more pistons and one or more biasing elements. In one example, the biasing elements may be arranged within the channels between the pistons and an end of the channels. In one particular example, the pistons may be secured together via a mounting block arranged between the pistons at one end of the pistons. In one particular example, the enclosure may include one or more ports configured to permit cooling fluid to pass into and out of the channels of the enclosure. Further, in one example, the center of the channels and the center of the ports may be coaxially aligned.

In one example, when expanding the server slide, the second rail is telescoped outwards from the first rail via one or more bearings held in the bearing cage. As the second rail is telescoped outwards, the pistons separate from the one or more biasing elements and cooling fluid is sucked into the channels of the enclosure via the one or more ports. In one example, when the mounting block abuts a first position limiter, a third rail may be telescoped outwards from the second rail until the server slide is completely expanded.

In another example, when contracting the server slide, the third rail is telescoped inwards within the second rail. Following this, the second rail is telescoped inwards within the first rail. In one example, when the end of the second rail contacts the mounting block, the second rail moves the mounting block. In one example, as the mounting block moves, the pistons move within the channels until the pistons contact the biasing elements, which compresses the biasing elements. Further, as the pistons move within the channels, the pistons force the cooling fluid from within the channels to flow out of the ports, which damps movement of the slide rail (and thus the server).

In one example, the server slide includes a first rail, a second rail, and a third rail, with the second rail telescopically held within the first rail, and the third rail telescopically held within the second rail. In one example, a damping system is secured to an end of the first rail. The damping system may include an enclosure having one or more channels configured to receive one or more pistons. The pistons may be configured to slide within the channels to intake and expel cooling fluid to/from within the channels via one or more ports extending through the enclosure. In one example, one or more biasing elements may be arranged within the channels. In another example, the pistons may be secured together via a mounting block.

In one example, as the sever slide is extended, the pistons lose contact with the biasing elements, and as the pistons move within the channels, cooling fluid from the tank is sucked into the channels via the one or more ports. During expansion of the server slide, the mounting block moves (and thus the pistons move) until the mounting block contacts the first position limiter. In another example, when the server slide is contracted, the end of the second rail abuts the mounting block to compress the pistons within the channels such that the biasing element is compressed. Further, compression of the pistons within the channels forces the cooling fluid out of the channels via the ports, which damps movement of the server slide. Thus, expulsion of cooling fluid through the ports, in combination with the biasing element, absorbs a portion of the force generated by dropping the server (e.g., due to gravity), which mitigates the risk of damage to the server and may prolong the lifespan of the server.

Referring still to FIGS. 12-20, in one example, the server slide 1200 includes a first (e.g., fixed) rail 1210 and one or more movable rails (e.g., second rail 1215 and third rail 1220). In one example, the server slide 1200 may be immersed in a cooling fluid 120 (e.g., a dielectric fluid) configured to facilitate cooling of the server 210 secured to the server slide 1200. In one example, the damping system 1205 may be configured to facilitate damping (e.g., a reduction in movement speed) of the server slide during contraction of the server slide to mitigate the risk of damage to the server.

In one example, the damping system 1205 may be secured to one end of the first rail 1210. The damping system 1205 may include an enclosure 1305 including one or more channels 1605 configured to receive one or more pistons 1310. In one example, the pistons 1310 may be slidably engaged with the channels 1605 to facilitate the intake and expulsion of cooling fluid 120 to/from the channels 1605. In one example, the cooling fluid 120 may be taken in and expelled from the channels 1605 via one or more ports 1505 extending through the enclosure 1305. In one particular example, the ports 1505 may be positioned on a base of the enclosure 1305. However, in other examples, the ports 1505 may be positioned in other areas of the enclosure 1305 (e.g., one or more sides of the enclosure 1305). In another example, one or more biasing elements 1610 may be arranged within the channels 1605, between the base of the enclosure 1305 and the pistons 1310. In one example, a mounting block 1315 may be secured to one end of the pistons 1310 (e.g., an end opposite the end within the channels 1605) to connect the pistons 1310 together.

In one example, the second rail 1215 may nest within the first rail 1210. Correspondingly, the third rail 1220 may nest within the second rail 1215, such that telescopic movement of the server slide 1200 is facilitated. In one example, a bearing cage 1905 is arranged between the first rail 1210 and the second rail 1215. The bearing cage 1905 may contain one or more roller bearings 1910 to facilitate slidable engagement between the first and second slide rails 1210, 1215. In one example, both the first and second rails 1210, 1215 may include a stopper 2005 configured to retain the bearing cage 1905. For example, the stopper 2005 may restrict movement of the bearing cage 1905 to avoid accidental removal of the bearing cage 1905 from the server slide 1200.

In one example, the enclosure 1305 may include one or more locking tabs 1405 extending away from a bottom surface of the enclosure 1305. The locking tabs 1405 may be configured to slide into one or more slots 1915 on the first rail 1210 to removably secure the damping system 1205 to the first rail 1210. In one example, the first rail 1210 may include a position limiter 1920 extending from the first rail 1210. The position limiter 1920 may be configured to limit an amount of travel of the mounting block 1315 (e.g., to avoid accidental removal of the pistons 1310 from the channels 1605). In another example, the second and third rails 1215, 1220 may include one or more position limiters 1705 configured to restrict the overall movement distance of the second and third rails 1215, 1220.

In one example, a slide release 1710 may be arranged between the second and third rails 1215, 1220. Correspondingly, the second rail 1215 may include a protrusion 1805 extending away from an interior surface of the second rail 1215. In one example, the protrusion 1805 may be configured to engage the slide release 1710 to lock relative movement of the second and third rails 1215, 1220. In another example, the bearing cage 1905 may include a protrusion 1810 configured to slidably engage a slot 1820 of the slide release 1710. The slide release 1710 may further include a lever 1815 to permit a user to engage or disengage the slide release 1710. In another example, an elastic component 1830 may be connected to the lever 1815. The elastic component 1830 may be configured to bias the lever 1815 into a locked position. In one example, to separate the second and third rails 1215, 1220, the user actuates the lever 1815 to disengage the protrusion 1805 from a cutout 1825, which permits a user to slide the third rail 1220 out of engagement with the second rail 1215.

In one example, when expanding the server slide 1200, the second rail 1215 is moved outwards with respect to the first rail 1210 via the one or more roller bearings 1910 of the bearing cage 1905. As the second rail 1215 moves away from the first rail 1210, the pistons 1310 lose contact with the biasing elements 1610 and cooling fluid 120 from the tank 105 enters the channels 1605 of the enclosure via the ports 1505. When the mounting block 1315 contacts the first position limiter 1920, the third rail 1220 may begin to move outwards with respect to the second rail 1215.

In another example, when contracting the server slide 1200, the third rail 1220 is moved inwards with respect to the second rail 1215. For example, to permit contraction of the third rail 1220 within the second rail 1215, the user may actuate the slide release 1710. In one example, once the third rail 1220 contracts within the second rail 1215, the second rail 1215 begins to move inwards with respect to the first rail 1210. In one example, when the second rail 1215 contacts the mounting block 1315, the second rail 1215 actuates the mounting block 1315 towards the enclosure 1305. Thus, the pistons 1310 secured to the mounting block 1315 slide inwards within the channels 1605, which compresses the biasing elements 1610. Correspondingly, the cooling fluid 120 within the channels 1605 is forced out of the ports 1505, which damps movement of the server slide 1200.

In one example, during operation of the damping system 1205, when expanding the server slide 1200, the second rail 1215 and the third rail 1220 are moved outwards (e.g., vertically upwards in a first direction) in sequence. Correspondingly, the pistons 1310 lose contact with the biasing elements 1610 via movement of the mounting block 1315. Thus, cooling fluid 120 passes from the tank 105 into the channels 1605 via the ports 1505. In one example, when the mounting block 1315 contacts the position limiter 1920 the server slide 1200 is fully extended.

In another example, when contracting the server slide 1200, the second rail 1215 and the third rail 1220 are moved inwards (e.g., vertically downwards in a second direction) in sequence, In one example, when the second rail 1215 contacts the mounting block 1315, the second rail 1215 continues to move inwards. The inward movement of the second rail 1215 actuates the mounting block 1315, which moves the pistons 1310 within the channels 1605. In one example, movement of the pistons 1310 within the channels 1605 compresses the biasing elements 1610, Correspondingly, the pistons 1310 force the cooling fluid 120 within the channels 1605 out of the ports 1505, thereby forming a buffer. In one example, when the position limiter 1705 of the second rail 1215 comes in contact with the stopper 2005 of the first rail 1210, the server slide 1200 is fully contracted.

In some implementations, devices or systems disclosed herein can be utilized, manufactured, or installed using methods embodying aspects of the invention. Correspondingly, any description herein of particular features, capabilities, or intended purposes of a device or system is generally intended to include disclosure of a method of using such devices for the intended purposes, a method of otherwise implementing such capabilities, a method of manufacturing relevant components of such a device or system (or the device or system as a whole), and a method of installing disclosed (or otherwise known) components to support such purposes or capabilities. Similarly, unless otherwise indicated or limited, discussion herein of any method of manufacturing or using for a particular device or system, including installing the device or system, is intended to inherently include disclosure, as embodiments of the invention, of the utilized features and implemented capabilities of such device or system.

Also as used herein, unless otherwise limited or defined, "or" indicates a non-exclusive list of components or operations that can be present in any variety of combinations, rather than an exclusive list of components that can be present only as alternatives to each other. For example, a list of "A, B, or C" indicates options of: A; B; C; A and B; A and C; B and C; and A, B, and C. Correspondingly, the term "or" as used herein is intended to indicate exclusive alternatives only when preceded by terms of exclusivity, such as "either," "one of," "only one of," or "exactly one of" For example, a list of "one of A, B, or C" indicates options of: A, but not B and C; B, but not A and C; and C, but not A and B. A list preceded by "one or more" (and variations thereon) and including "or" to separate listed elements indicates options of one or more of any or all of the listed elements. For example, the phrases "one or more of A, B, or C" and "at least one of A, B, or C" indicate options of: one or more A; one or more B; one or more C; one or more A and one or more B; one or more B and one or more C; one or more A and one or more C; and one or more of A, one or more of B, and one or more of C. Similarly, a list preceded by "a plurality of" (and variations thereon) and including "or" to separate listed elements indicates options of multiple instances of any or all of the listed elements. For example, the phrases "a plurality of A, B, or C" and "two or more of A, B, or C" indicate options of: A and B; B and C; A and C; and A, B, and C.

As used herein, unless otherwise defined or limited, directional terms are used for convenience of reference for discussion of particular figures or examples. For example, references to downward (or other) directions or top (or other) positions may be used to discuss aspects of a particular example or figure, but do not necessarily require similar orientation or geometry in all installations or configurations.

Also as used herein, unless otherwise limited or defined, "substantially parallel" indicates a direction that is within ±12 degrees of a reference direction (e.g., within ±6 degrees), inclusive. For a path that is not linear, the path can be considered to be substantially parallel to a reference direction if a straight line between end-points of the path is substantially parallel to the reference direction or a mean derivative of the path within a common reference frame as the reference direction is substantially parallel to the reference direction.

Also as used herein, unless otherwise limited or defined, "substantially perpendicular" indicates a direction that is within ±12 degrees of perpendicular a reference direction (e.g., within ±6 degrees), inclusive. For a path that is not linear, the path can be considered to be substantially perpendicular to a reference direction if a straight line between end-points of the path is substantially perpendicular to the reference direction or a mean derivative of the path within a common reference frame as the reference direction is substantially perpendicular to the reference direction.

Also as used herein, unless otherwise limited or defined, "integral" and derivatives thereof (e.g., "integrally") describe elements that are manufactured as a single piece without fasteners, adhesive, or the like to secure separate components together. For example, an element stamped, cast, or otherwise molded as a single-piece component from a single piece of sheet metal or using a single mold, without rivets, screws, or adhesive to hold separately formed pieces together is an integral (and integrally formed) element. In contrast, an element formed from multiple pieces that are separately formed initially then later connected together, is not an integral (or integrally formed) element.

Additionally, unless otherwise specified or limited, the terms "about" and "approximately," as used herein with respect to a reference value, refer to variations from the reference value of ±15% or less, inclusive of the endpoints of the range. Similarly, the term "substantially equal" (and the like) as used herein with respect to a reference value refers to variations from the reference value of less than ±10%, inclusive. Where specified, "substantially" can indicate in particular a variation in one numerical direction relative to a reference value. For example, "substantially less" than a reference value (and the like) indicates a value that is reduced from the reference value by 10% or more, and "substantially more" than a reference value (and the like) indicates a value that is increased from the reference value by 10% or more.

Also as used herein, unless otherwise limited or specified, "substantially identical" refers to two or more components or systems that are manufactured or used according to the same process and specification, with variation between the components or systems that are within the limitations of acceptable tolerances for the relevant process and specification. For example, two components can be considered to be substantially identical if the components are manufactured according to the same standardized manufacturing steps, with the same materials, and within the same acceptable dimensional tolerances (e.g., as specified for a particular process or product).

The previous description of the disclosed embodiments is provided to enable any person skilled in the art to make or use the invention. Given the benefit of this disclosure, various modifications to these embodiments will be readily apparent to those skilled in the art, and the principles defined herein may be applied to other embodiments without departing from the spirit or scope of the invention. Thus, the invention is not intended to be limited to the embodiments shown herein but is to be accorded the widest scope consistent with the principles and novel features disclosed herein.

The invention claimed is:

1. A server system for use with a tank that contains cooling fluid, the server system comprising:
  a server slide that is immersed within the cooling fluid to movably support a server chassis relative to the tank, the server slide including:
    a slide assembly that is extendable between a contracted orientation, in which the slide assembly supports the server chassis with the server chassis within the cooling fluid and an extended orientation, in which the slide assembly supports the server chassis with the server chassis outside the cooling fluid; and
    a damping system, including:
      an enclosure that defines an interior volume; and
      a piston slidably arranged within the interior volume;
      the interior volume being open to the tank via a fluid channel that receives the cooling fluid into the interior volume to dampen movement of the slide assembly.

2. The system of claim 1, wherein the damping system is mounted to a first end of the slide assembly so that movement of the slide assembly corresponds to movement of the piston.

3. The system of claim 2, wherein movement of slide assembly in a first vertical direction moves the piston in a first direction to draw the cooling fluid into the interior volume of the enclosure.

4. The system of claim 3, wherein movement of the slide assembly in a vertical second direction, opposite the first vertical direction, moves the piston in a second direction to expel the cooling fluid from the interior volume of the enclosure.

5. The system of claim 4, wherein the cooling fluid is drawn into and expelled from the interior volume via a port arranged on the enclosure.

6. The system of claim 5, wherein the interior volume is formed as an interior channel that defines a central axis, wherein the port defines a central axis, and wherein the interior channel and the port are coaxially aligned.

7. The system of claim 5, wherein a cross-sectional area of the interior volume, measured on a plane perpendicular to a direction of slidable movement of the piston, is larger than a cross-sectional area of the port, measured on a plane perpendicular to a direction of flow through the port.

8. The system of claim 1, further comprising:
  a biasing element arranged within the interior volume of the enclosure and engaged with the slide assembly to provide a biasing force relative to extensive or retractive movement of the slide assembly.

9. The system of claim 8, wherein the biasing element is arranged within the interior channel between the piston and a port arranged on the enclosure, and wherein the biasing element is compressed by the piston when the slide assembly is in the contracted orientation.

10. The system of claim 1, wherein the enclosure is U-shaped and defines multiple interior volumes, each of which receives a corresponding piston of multiple pistons.

11. The system of claim 1, wherein the cooling fluid is a dielectric fluid.

12. The system of claim 1, wherein the server slide is a first server slide of a plurality of server slides and each server slide of the plurality includes:

a slide assembly that is extendable between a contracted orientation, in which the slide assembly supports a corresponding server chassis with the corresponding server chassis within the cooling fluid and an extended orientation, in which the slide assembly supports the corresponding server chassis with the server chassis outside the cooling fluid; and a damping system, including:

an enclosure that defines an interior volume; and a piston slidably arranged within the interior volume;

the interior volume being open to the tank via a fluid channel that receives the cooling fluid into the interior volume to dampen movement of the slide assembly.

13. A server slide for use in an immersion cooling system, the server slide comprising:

a slide assembly that is telescopically movable to adjust a position of a server and is at least partly surrounded by a cooling liquid;

a damping system, including:

an enclosure defining an interior volume; and a piston positioned within the interior volume;

the slide assembly being telescopically vertically extendable to actuate the piston in a first direction and draw the cooling liquid into the interior volume of the enclosure; and the slide assembly being telescopically vertically retractable to actuate the piston in a second direction and expel cooling liquid from within the interior volume.

14. The system of claim 13, wherein the slide assembly includes a telescoping server slide;

wherein the damping system is mounted to a lower end of the telescoping server slide; and wherein movement of the server slide corresponds to movement of the piston.

15. The system of claim 13, wherein the interior volume of the enclosure is defined by an interior channel;

wherein the piston is slidably arranged within the interior channel; and wherein movement of the piston in a first direction draws the cooling liquid into the interior channel and movement of the piston in a second, opposite direction expels cooling liquid from the interior channel.

16. The system of claim 15, wherein the cooling liquid is drawn into and expelled from the interior channel via a port arranged on the enclosure.

17. The system of claim 16, wherein the interior channel defines a central axis, wherein the port defines a central axis, and wherein the interior channel and the port are coaxially aligned.

18. The system of claim 16, wherein a cross-sectional area of the interior channel is larger than a cross-sectional area of the port.

19. A method of damping movement of a server slide in a server system for use with a tank that contains cooling liquid, the method comprising:

moving the server slide in an upward vertical direction to raise a server supported by the server slide out of the tank of cooling liquid, so that upward vertical movement of the server slide causes an intake of the cooling liquid from the tank into a damping system of the server slide; and moving the server slide in a downward vertical direction to return the server into the tank of cooling liquid, so that downward vertical movement of the server slide causes the cooling liquid to be expelled from the damping system of the server slide into the tank.

20. The method of claim 19, wherein moving the server slide in a downward vertical direction to return the server into the tank of cooling liquid compresses a spring of the damping system so that a responsive force from the spring and from the cooling liquid being expelled from the damping system resists the movement of the server slide in the downward vertical direction.

* * * * *